(12) United States Patent
Thallner (10) Patent No.: US 6,416,579 B1
(45) Date of Patent: Jul. 9, 2002

(54) APPARATUS FOR TREATING SILICON WAFERS

(76) Inventor: Erich Thallner, Bubing 71, A-4780 Schärding (AT)

( * ) Notice: Subject to any disclaimer, the term of this patent is extended or adjusted under 35 U.S.C. 154(b) by 0 days.

(21) Appl. No.: 09/481,995

(22) Filed: Jan. 11, 2000

(30) Foreign Application Priority Data

Jan. 13, 1999 (AT) .............................................. A40/99

(51) Int. Cl.$^7$ ................................................ B05C 5/00
(52) U.S. Cl. ..................... 118/323; 118/724; 118/715
(58) Field of Search .................... 118/715, 52, 323, 118/315, 64, 69, 712, 302, 728, 724, 667

(56) References Cited

U.S. PATENT DOCUMENTS

| | | | |
|---|---|---|---|
| 4,190,015 A | * | 2/1980 | Hillman |
| 4,313,783 A | * | 2/1982 | Davies et al. |
| 4,807,561 A | | 2/1989 | Ebata |
| 4,827,867 A | * | 5/1989 | Takei et al. |
| 5,180,431 A | * | 1/1993 | Sugimoto et al. |
| 5,250,114 A | * | 10/1993 | Konishi et al. |
| 5,250,116 A | * | 10/1993 | Taninoto |
| 5,449,405 A | * | 9/1995 | Cardinali et al. |
| 5,489,337 A | | 2/1996 | Nomura et al. |
| 5,695,817 A | * | 12/1997 | Tatiyama et al. |
| 5,769,946 A | * | 6/1998 | Kutsuzawa et al. |
| 5,939,130 A | * | 8/1999 | Shiraishi et al. |
| 5,985,357 A | * | 11/1999 | Sanada |
| 6,190,063 B1 | * | 2/2001 | Akimoto |

FOREIGN PATENT DOCUMENTS

| | | |
|---|---|---|
| AT | 389 959 | 2/1990 |
| AT | 000 639 | 2/1996 |
| JP | 63-57779 | 3/1988 |
| JP | 09-25579 | 1/1997 |
| JP | 09-327671 | 12/1997 |
| JP | 10-189503 | 7/1998 |
| JP | 10-256131 | 9/1998 |
| JP | 10-335230 | 12/1998 |

* cited by examiner

*Primary Examiner*—Brenda A. Lamb
(74) *Attorney, Agent, or Firm*—Collard & Roe, P.C.

(57) ABSTRACT

An apparatus for the chemical treatment of disc-shaped semiconduct or substrates comprises a fluid-tight treatment chamber, a carrier for holding a disc-shaped substrate in the chamber, and an elongated spraying head having a plurality of nozzles for applying a fluid to at least one surface of the substrate. The spraying head is adjustably mounted in the treatment chamber and has a length corresponding at least to the diameter of the disc-shaped substrate. Fluid inlet conduits have portions leading from outside the treatment chamber into the chamber to the nozzles, and these fluid inlet conduit portions are adjustable with the spraying head. An adjustment drive displaces the spraying head transversely relative to the substrate over the surface thereof whereby the nozzles sweep over the surface in substantially parallel tracks, and at least one outlet is connected to a suction device for removing the applied fluid from the treatment chamber.

15 Claims, 7 Drawing Sheets

APPARATUS FOR TREATING SILICON WAFERS

BACKGROUND OF THE INVENTION

1. Field of the Invention

The present invention relates to an apparatus for the chemical treatment of disc-shaped semiconductor and silicon substrates, such as wafers.

2. Description of the Prior Art

Apparatus of this type is used for the purification before further treatment and for the chemical or physical treatment of such substrates, particularly wafers. The treatment may be automated to a large extent, and it is also known to automate the removal of the wafers from storage containers, the feeding of the wafers to the treatment chamber and the removal therefrom. In the most common wet-treatment, a multiplicity of wafers is brought into a bath in a common carrier. The dwell time of the carrier in the bath determines the progress of the treatment, for instance the etching. Different treatments, for example, etching, flushing and subsequently renewed etching, or coating require placing the carrier with the wafers in different baths. If only one surface of the wafer is to be treated, which is frequently the case, the opposite side must be protected from the treatment fluid, for example by applying a protective lacquer, which has to be subsequently removed.

Because of the difficulties encountered and also because, despite the circulation of the treatment medium or movement of the carrier in the bath, different treatment results have been obtained even with identical wafers, it is preferred to treat the wafers singly in an apparatus which comprises a treatment chamber with a carrier holding the wafer and nozzles applying fluids to at least one surface of the wafer. Apparatus of this type is known from Austrian patent No. 389,959 and Austrian utility model No. 000 639. A rotatingly driven substrate carrier is used, and stationary nozzles apply the treatment fluid thereto, the rotation having the object of distributing the fluid uniformly over the surface of the substrate. The chemical reaction is defined by the dwell time of the wafer in the treatment chamber, the rotary speed and the amount of the applied fluid. If only one surface is to be treated, the opposite surface of the wafer must be protected. In the known apparatus, the substrate carrier defines an annular wedge-shaped gap tapering outwardly from the center and ending at the edge of the substrate, and a protective gas is applied thereto under superatmospheric pressure. Using the so-called Bernoulli-effect, the flow of the treatment fluid due to the rapid rotation of the substrate carrier causes a vacuum at the edge of the substrate so that the protective gas is sucked off from the edge. To make it possible to use different treatment fluids, the substrate carrier may be vertically adjustable in a correspondingly high treatment chamber, and the fluid applying nozzles may be mounted vertically spaced in the chamber wall.

The known apparatus is complex and has a relatively large treatment chamber volume so that different treatment temperatures must be adjusted primarily by correspondingly controlling the temperature of the treatment fluids. Most importantly, the known apparatus has the disadvantage that different flow velocities of the treatment fluids over the substrate surface are generated by the rotation of the substrate and the application of the fluids by stationary nozzles so that the chemical reactions proceed differently over the substrate surface. Furthermore, it is almost impossible to treat the substrates fully with different fluids. Therefore, the wafers are usually treated in different chambers for different treatments. It is very difficult to use toxic and strongly etching media in the known apparatus.

It may be mentioned that it is known from U.S. Pat. No. 5,489,337 to lacquer wafers with a discharge nozzle for the lacquer, which extends over the diameter of the wafer and has a discharge slit. The opening width of the discharge slit is adjustable in accordance with the wafer width as the nozzle passes over the wafer. Such lacquer coating apparatus differs fundamentally from the type of chemical treatment apparatus with which this invention deals.

SUMMARY OF THE INVENTION

It is a primary object of the invention to provide an apparatus of the first-described type which not only has a simply constructed treatment chamber and substrate carrier but also enables the disc-shaped semiconductor or silicon substrate to be treated rapidly and uniformly, as well as to permit the substrate to be subjected to various treatments including final drying, to use toxic and highly corrosive treatment media without endangering the environment and the operating personnel, and even, if desired, to treat only one surface of the substrate while protecting the opposite surface without causing problems.

The above and other objects are accomplished according to the present invention with an apparatus for the chemical treatment of disc-shaped semiconductor substrates, such as wafers, which comprises a fluid-tight treatment chamber, a carrier for holding at least one disc-shaped substrate in the chamber, and an elongated spraying head having a plurality of nozzles for applying a fluid to at least one surface of the substrate. The spraying head is adjustably mounted in the treatment chamber and has a length corresponding at least to the diameter of the disc-shaped substrate. Fluid inlet conduit means have portions leading from outside the treatment chamber into the chamber to the nozzles, the fluid inlet conduit means portions in the chamber being adjustable with the spraying head. Adjustment drive means are provided for displacing the spraying head transversely relative to the substrate over the surface thereof whereby the nozzles sweep over the surface in substantially parallel tracks, and at least one outlet is connected to a suction device for removing the applied fluid from the treatment chamber.

In this apparatus, the treatment fluids, whether liquid or gaseous, may be applied to the substrate surface(s) substantially more uniformly and with greater flow velocity while a uniform flow velocity of the fluid may be maintained in all areas. Thus, a more uniform treatment result, for example in etching, may be obtained than with apparatus featuring rotating substrate carriers. Each treatment step is shortened because of the increased fluid flow velocity and the possibility of distributing larger amounts of treatment fluid over the surface(s) in the same time period.

The apparatus may further comprise fluid flow shut-off members in the fluid inlet conduit means outside the treatment chamber for selectively opening and closing fluid flow to at least some of the nozzles and to connect the nozzles to different inlet conduits. This makes it possible to shut off the fluid flow to selected nozzles or to connect such nozzles to different inlet conduits to enable the treatment to be matched to the surface area of the substrate being swept by the nozzles. The spraying heads may have different types of nozzles exchangeably mounted in the treatment chamber, together with different inlet conduit means for different fluids. The fluid inlet conduit means portions in the chamber may comprise different inlet conduits. In this way, different treatment media may be applied simultaneously or in succession. For example, different chemical substances for etching are fed to the nozzles in succession, each chemical substance being sucked off after each treatment and the complete removal of the chemical substances from the surface(s) not being spun off as heretofore but being flushed off by distilled water or another suitable liquid and subsequent drying, preferably with an inert gas, such as nitrogen, or spraying with alcohol, with subsequent partial evacuation of the treatment chamber. The treatment fluids may be aspirated from the chamber and re-used at least to a large extent. Since the chamber is hermetically closed, highly concentrated, aggressive or toxic chemicals may be used for the treatment of the substrates because the chemicals are sucked off, and the treatment chamber may be flushed several times or even dried before it is opened.

The apparatus may comprise a guide rod carrying the spraying head, the elongated spraying head extending transversely to the guide rod, the guide rod being adjustably movable in its longitudinal direction and the portion of the guide rod outside the treatment chamber being connected to the adjustment drive means. Preferably, the guide rod is hollow and forms at least a portion of the fluid inlet conduit means, and the hollow guide rod may pass out of the treatment chamber through a sluice chamber flushed with an inert medium.

It may be useful for the treatment of different wafers or the wafer treatment in a number of steps to mount two or more spraying heads having different types of nozzles, such as spraying, flushing and blowing nozzles, exchangeably in the treatment chamber, together with different inlet conduit means for different fluids.

If desired, the treatment chamber may have windows through which the treatment in the chamber may be observed, and/or measuring instrumentation for measuring the progress of the treatment.

The treatment chamber of the apparatus of this invention may have a relatively small volume and may be much less massive than treatment chambers of known apparatus of this type.

Therefore, it is possible and useful to arrange temperature regulating means outside the treatment chamber for heating or cooling the chamber. In this way, the required treatment temperatures may be generated and maintained at a constant level in the chamber.

If required, the apparatus may be so constructed that both surfaces of the substrate may be treated. In this case, the spraying head may be stationary and the substrate carrier may be reciprocable.

BRIEF DESCRIPTION OF THE DRAWING

The above and other objects, features and advantages of the invention will become more apparent from the following detailed description of certain now preferred embodiments thereof, taken in conjunction with the accompanying somewhat schematic drawing wherein.

DETAILED DESCRIPTION OF THE PREFERRED EMBODIMENTS

Figure 1:
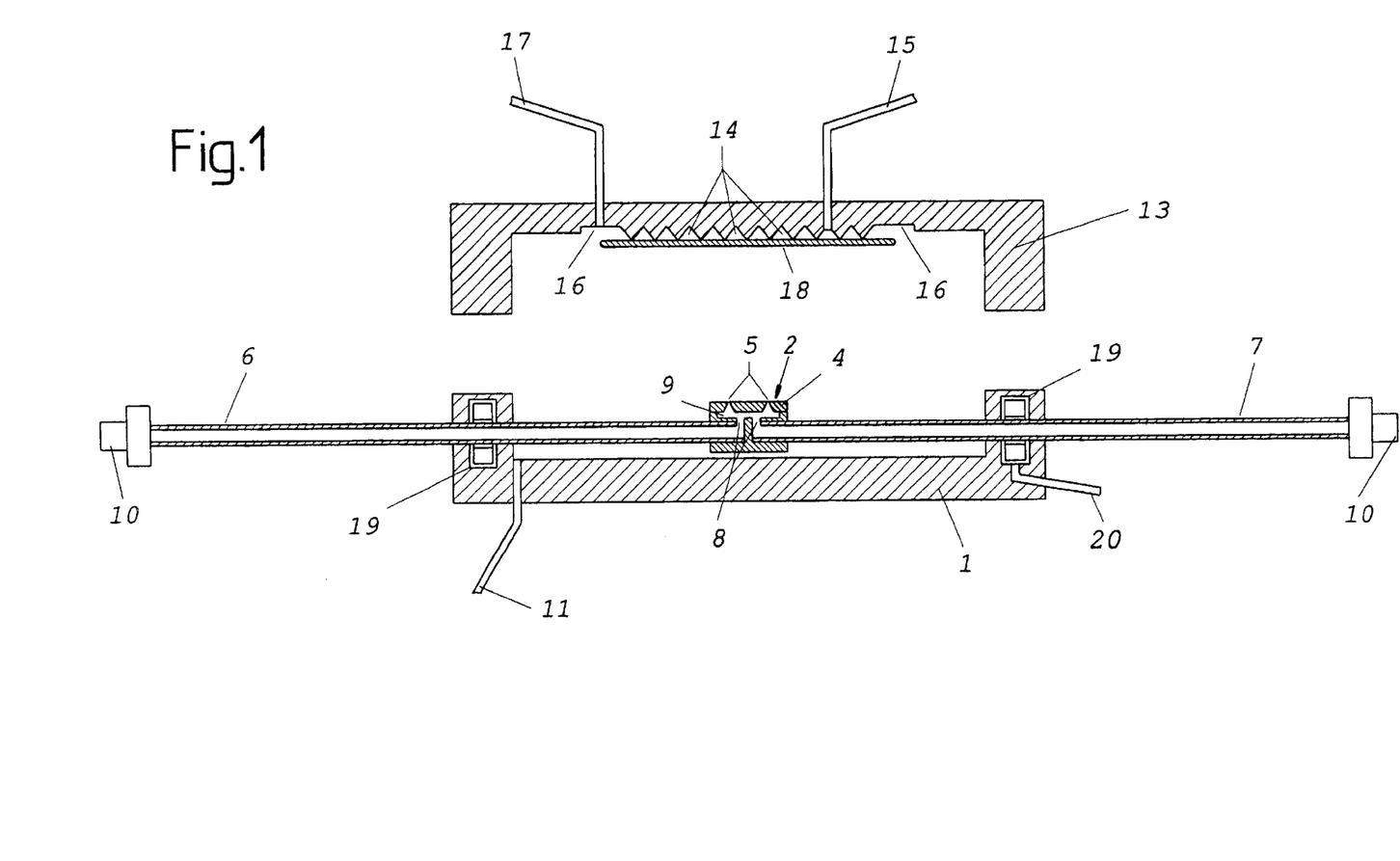
FIG. 1 is a sectional view showing the essential parts of one embodiment of an apparatus according to the present invention, with the treatment chamber being illustrated in the opened state.

Referring now to the drawing, wherein like reference numerals designate like parts functioning in a like manner in all figures, the apparatus for the chemical treatment of disc-shaped semiconductor substrates shown in FIG. 1 comprises a fluid-tight treatment chamber defined by lower housing portion 1 and upper portion or cover 13 arranged to fit hermetically over the lower housing portion to close the chamber fluid-tight. Carrier for holding at least one disc-shaped substrate, such as wafer 18, is provided in the chamber. The illustrated carrier consists of flutes 14 in cover 13, which are connected to a vacuum conduit 15 so that the wafer is held on the cover by suction. Furthermore, blocking groove 16 is flushed with an inert gaseous medium, preferably nitrogen, supplied through conduit 17, and the groove extends along the edge of the disc-shaped substrate and the carrier whereby penetration of the fluid applied to the lower surface of the wafer to the opposite surface is prevented.

Elongated spraying head 2 having a plurality of nozzles 5 for applying a fluid, such as a chemical substance, a scavenging liquid or a gaseous medium, to the lower surface of substrate 18 is adjustably mounted in the treatment chamber and has a length corresponding at least to the diameter of the disc-shaped substrate. Guide rods 6, 7 carry spraying head 2, the elongated spraying head extending transversely to the guide rod. The guide rods are adjustably movable in the longitudinal direction and the portion of the guide rod outside the treatment chamber is connected to an adjustment drive means for displacing. The illustrated guide rods 6, 7 are hollow and form at least a portion of fluid inlet conduit means having portions leading from outside the treatment chamber into the chamber to nozzles 5, the fluid inlet conduit means portions in the chamber being adjustable with spraying head 2. Channels 8, 9 in spraying head 2 lead from the inlet conduit means to nozzles 5.

As shown, the hollow guide rods pass out of the treatment chamber through sluice chambers 19 in lower housing part 1 of the chamber. The sluice chambers are flushed with an inert medium, for example distilled water or nitrogen, supplied through conduits 20 to prevent leaking of the treatment fluids through the passages of the guide rods through lower housing part 1.

Adjustment drive means (not shown) displace spraying head 2 carried by guide rods 6, 7 transversely relative to substrate 18 over the surface thereof whereby nozzles 5 sweep over the surface in substantially parallel tracks. Couplings 10 connect hollow guide rods 6, 7 to conduits supplying treatment fluids from storage tanks to the nozzles. Outlet 11 leads from lower part 1 of the treatment chamber to a suction device for removing the applied fluid from the treatment chamber and, if desired, the fluid is recycled to a storage tank for further user in modified spraying head 2 illustrated in FIG. 2, the treatment fluids are supplied only through hollow rod 6 forming a portion of the fluid inlet conduit means while hollow rod 7 is connected to a suction conduit so that the applied fluid is sucked oft through outlet 12.

Fluid flow shut-off members in the fluid inlet conduit means outside the treatment chamber enable the fluid flow to be selectively opened and closed to at least some of the nozzles and to connect the nozzles to different inlet conduits. Such valves are well known and are, therefore, not shown, as are non-illustrated pumps and other suitable fluid delivery devices which may be provided. Also, spraying heads 2 with different types of nozzles, such as spray, flushing and blow nozzles, may be exchangeably mounted in the treatment chamber, together with different inlet conduit means for different fluids.

Figure 2:
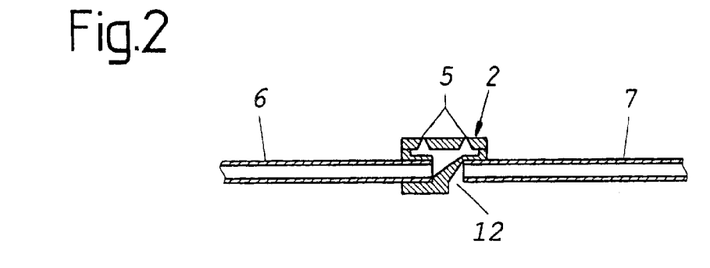
FIG. 2 shows a modified embodiment of the spraying head of the apparatus of FIG. 1, in section.
Figure 3:
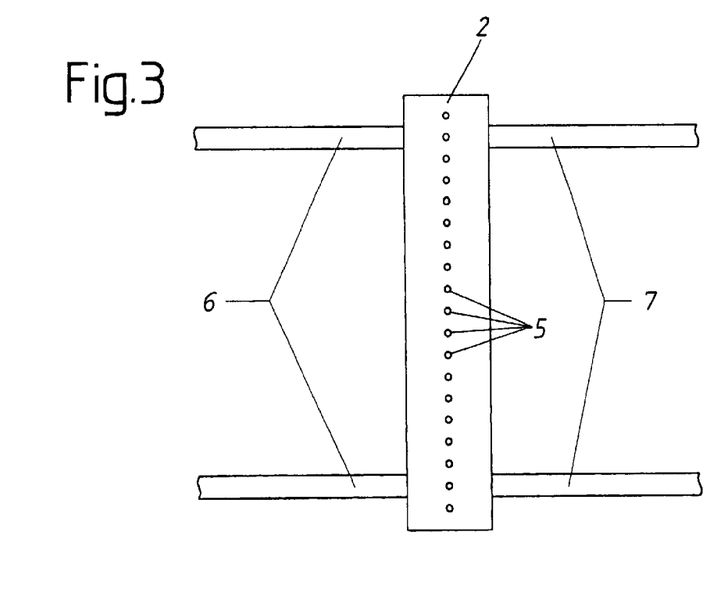
FIG. 3 is a bottom view of another embodiment of the spraying head and guide rods carrying the spraying head.

FIG. 3 illustrates an embodiment in which two hollow guide rods 6, 7 carry each end of elongated spraying head 2. While only one row of nozzles 5 is shown, several rows of nozzles may be provided, as indicated in FIGS. 1 and 2. The nozzles in each row or individual rows may be simultaneously supplied with different treatment fluids delivered by different inlet conduits arranged in hollow guide rods 6, 7, each particularly adapted for conducting a different treatment fluid, respective nozzles being adapted for liquid and gaseous media, such as spray nozzles for liquid chemicals and flushing nozzles for cleaning liquids.

Figure 4:
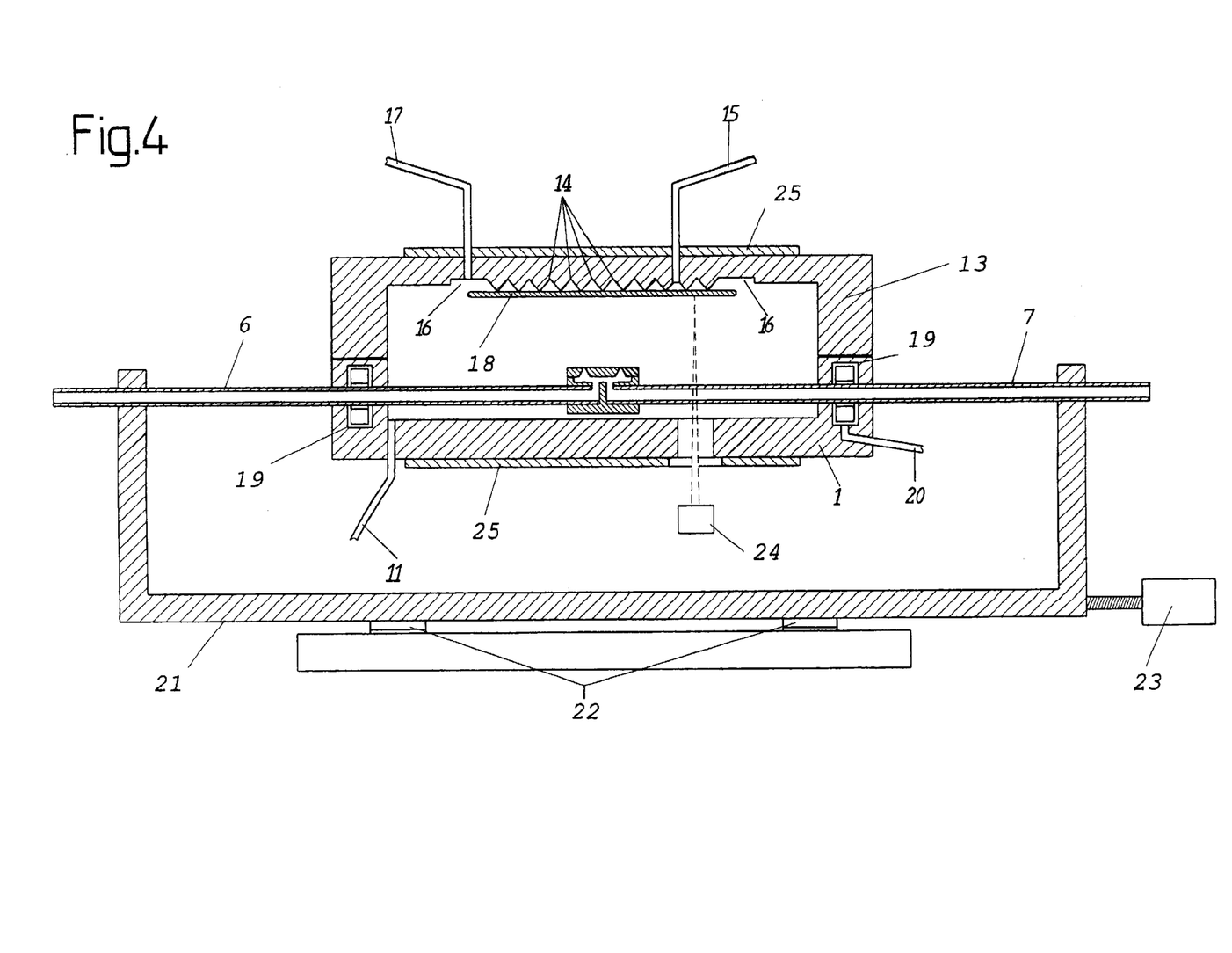
FIG. 4 illustrates the entire apparatus incorporating the parts shown in FIG. 1, in a like view.

FIG. 4 illustrates the entire apparatus, including the essential parts shown in FIG. 1 and described hereinabove, the treatment chamber being hermetically closed. In the illustrated embodiment, hollow guide rods 6, 7 are held by carrier body 21 supported on guide track 22. Adjustment drive 23 moves carrier body 21 back and forth so that guide rods 6, 7 are moved in the longitudinal direction and the spraying head carried by guide rods is displaced transversely to substrate 18 and over the surface thereof whereby the nozzles sweep over the surface in substantially parallel tracks to apply the treatment fluid uniformly to the substrate surface. The lower housing part of the treatment chamber has a window through which the treatment in the chamber may be observed. The progress of the treatment may be measured by a Measuring instrumentation, for example a laser distance measuring instrument. However, it may also be desirable to use a television camera to observe the treatment process. measuring instrumentations useful for specific purposes are well known and are, therefore, not further described. Furthermore, the apparatus comprises temperature regulating means 25 outside the treatment chamber for heating or cooling the chamber. It would also be possible to heat the treatment chamber by microwaves And/or to deliver the treatment fluids at a predetermined temperature.

Figure 5:
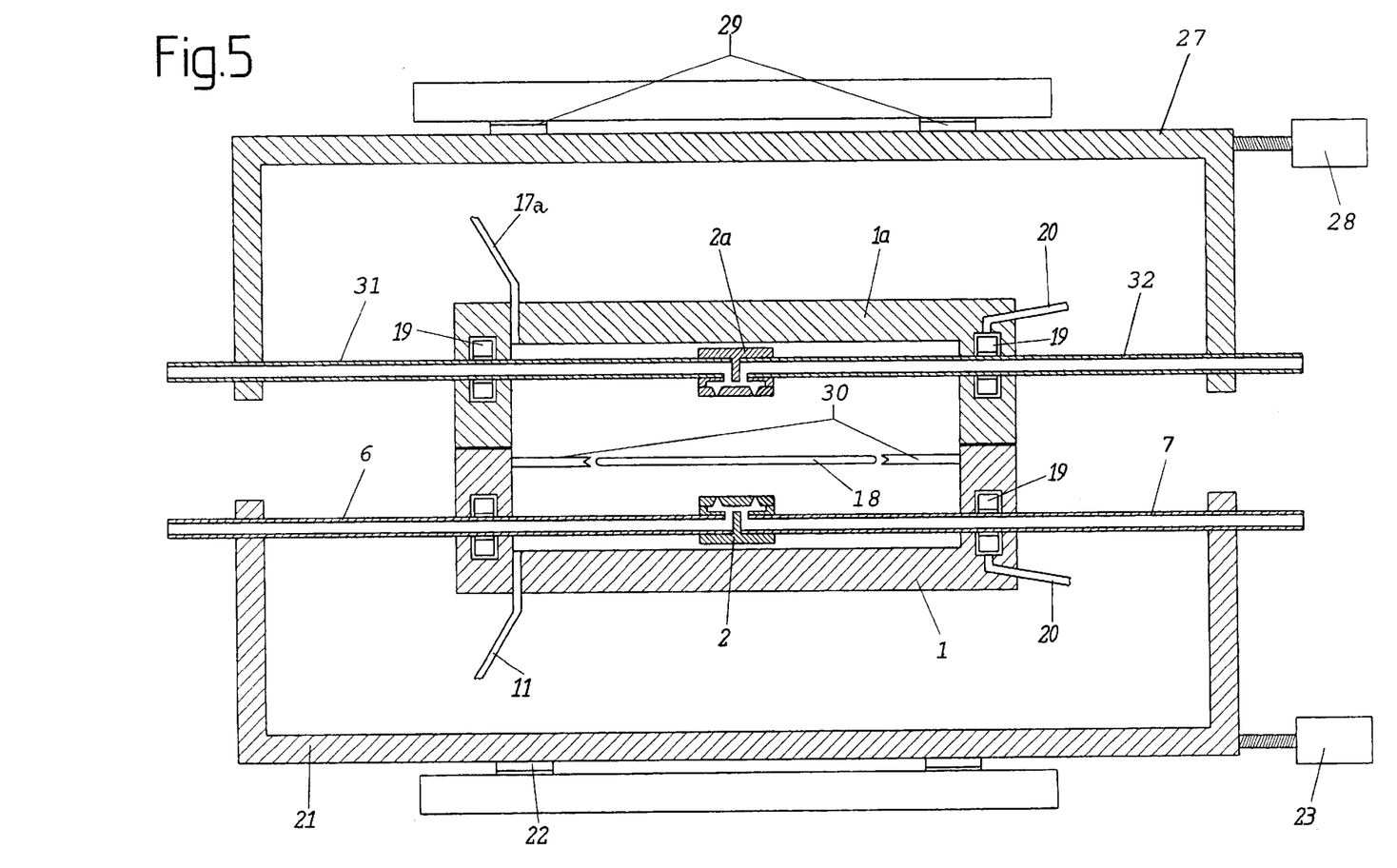
FIG. 5 illustrates an apparatus capable of treating both surfaces of a disc-shaped semiconductor substrate.

FIG. 5 illustrates an embodiment of the apparatus wherein carrier 30 of disc-shaped substrate 18 is arranged to hold the edge of the substrate while leaving both surfaces of the substrate unobstructed. A respective one of the elongated spraying heads 2, 2a is adjustably mounted in the treatment chamber for applying fluid to each surface. Lower housing part 1 and upper housing part 1a are symmetrically arranged, except for substrate carrier 30 which is mounted in the lower housing part. Except for the substrate carrier, the lower portion of the apparatus is the same as that shown in FIG. 4, the upper portion being symmetrically arranged. Guide rods 31, 32 in upper housing part 1a carry spraying head 2a and are carried by carrier body 27 which is movable transversely to substrate 18 along guide track 29 by adjustment drive 28.

The apparatus shown in FIG. 5 is particularly useful in a treatment in which the entire chamber is filled with a liquid, for instance a suitable chemical substance, only during a portion of the entire treatment process. With the treatment chamber filled with a liquid, the synchronous back-and-forth movement of spraying heads 2, 2a will generate a current which rapidly sweeps over both surfaces of substrate 18. Additional inlet 17a is provided for filling the treatment chamber with a fluid treatment medium.

Figure 6:
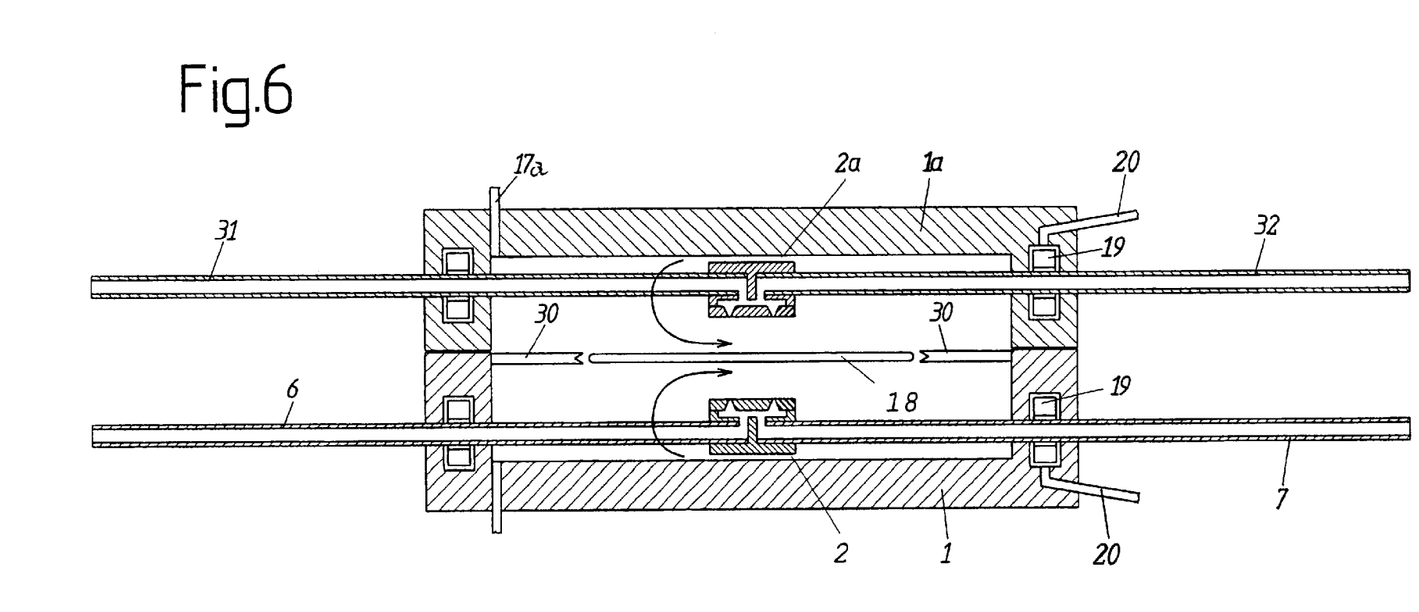
FIG. 6 shows a treatment variant of the treatment chamber of FIG. 5.

This process variant is indicated in FIG. 6, the arcuate arrows showing the currents produced by the reciprocal movement of spraying heads 2, 2a. These currents may be enhanced by operating the nozzles, too. The final drying after the chemical treatment is also effected by applying a gaseous drying medium through the nozzles.

In all instances, the treatment may be accelerated and made more uniform by vibrating the treatment chamber with the substrate held therein or the spraying heads by ultrasonic or electromagnetic energy.

Figure 7:
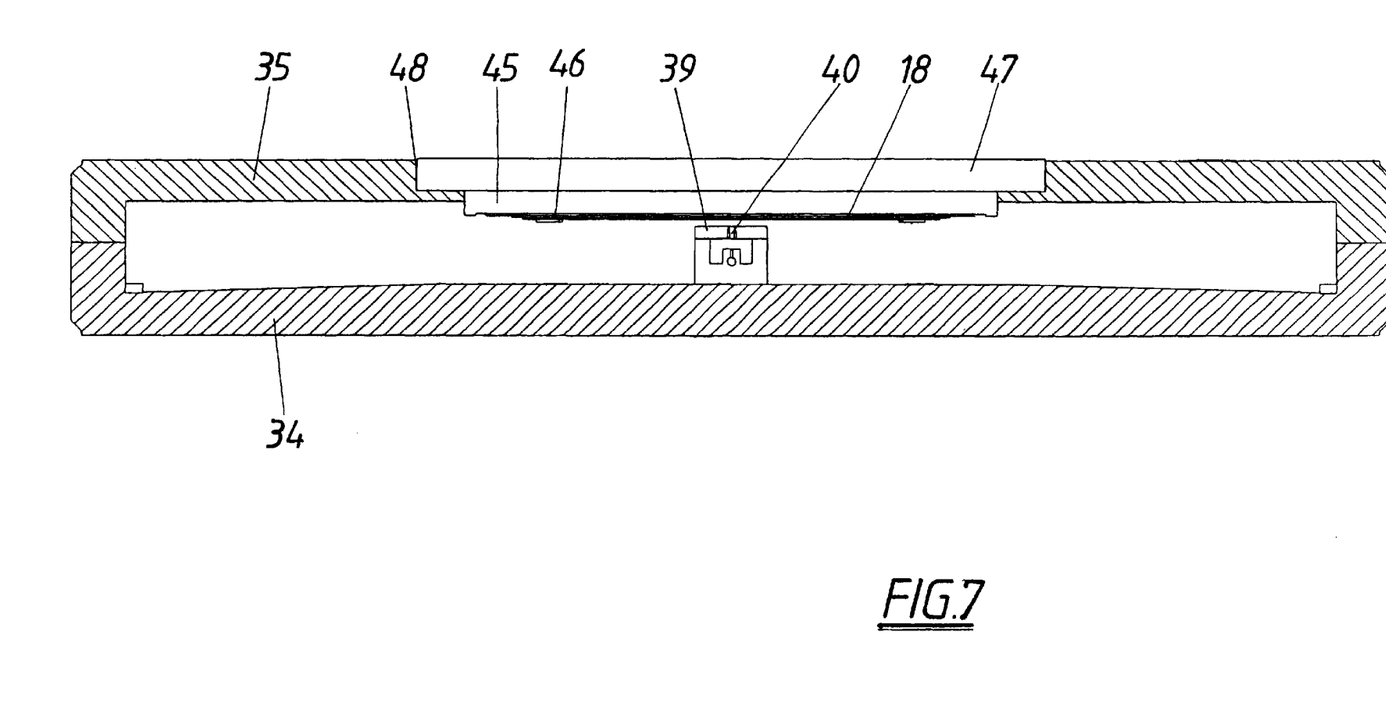
FIG. 7 is a sectional view of another embodiment of the essential parts of the apparatus, the adjustment drive means being omitted.
Figure 8:
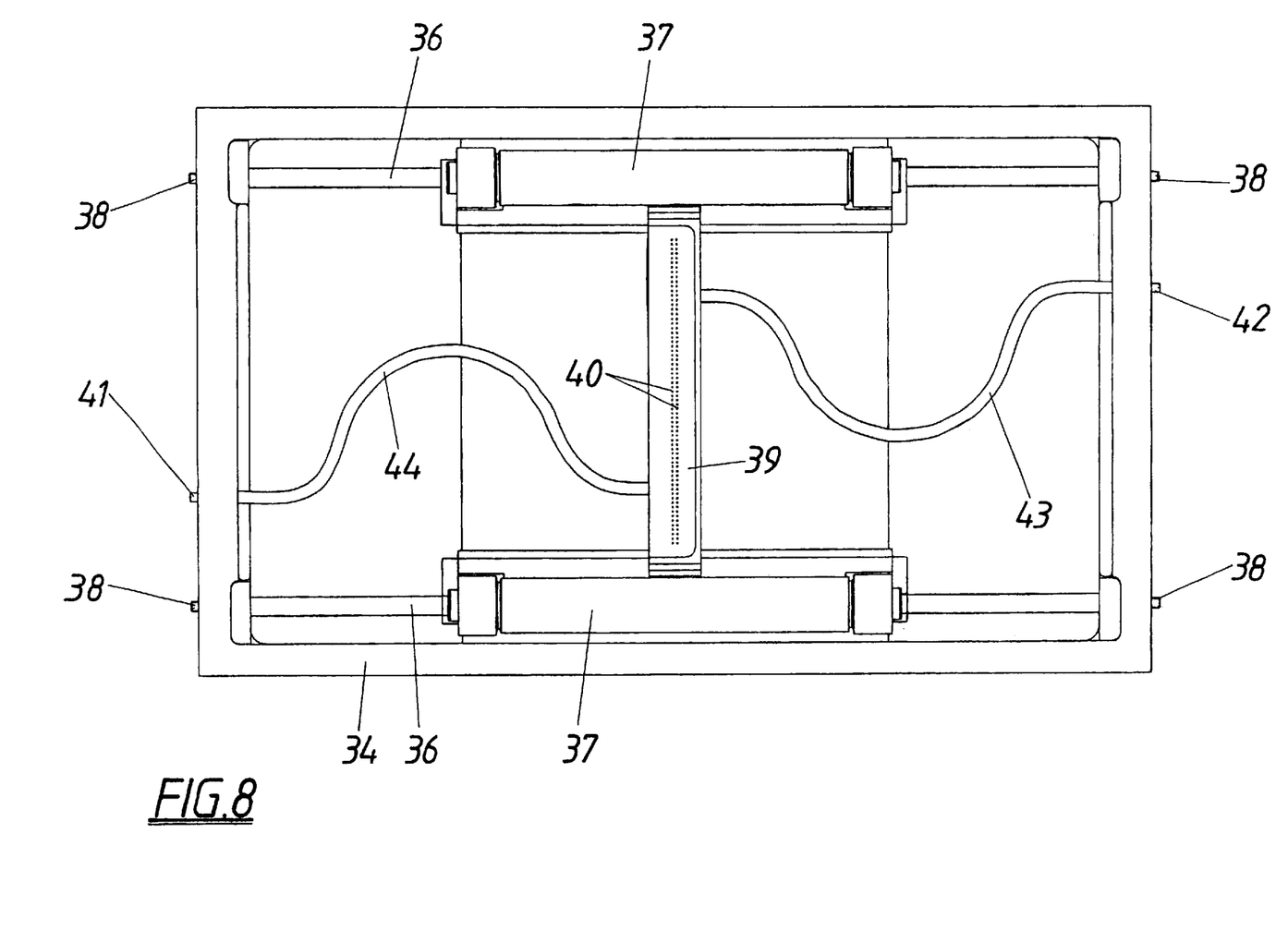
FIG. 8 is a top view of FIG. 7, with the upper cover removed to show the inside of the treatment chamber.

The apparatus illustrated in FIGS. 7 and 8 comprises a flat fluid-tight treatment chamber defined by lower housing part 34 and upper housing part 35. As shown in FIG. 8, the adjustment drive means in this embodiment comprise two cylinder-piston units 36, 37 operable by a pressure medium supplied thereto from outside the treatment chamber for reciprocably displacing spraying head 39. Cylinders 37 receive the liquid or gaseous pressure medium through hollow piston rods which are connected by couplings 38 to a pressure medium source. The cylinders will move to one side or the other, depending on which side the pressure medium is supplied to. The two cylinders carry elongated sprinkling head 39 which has a multitude of nozzle openings 40. Flexible inlet conduit hoses 43, 44 connect Spraying head 39 to couplings 41, 42 so that the inlet conduit hoses may receive treatment fluids from a source of such fluids. In this way, flexible hoses 43, 44 form portions of the fluid inlet conduit means leading from outside the treatment chamber into the chamber to the nozzles, which portions in the chamber are adjustable with the spraying head.

As in all the other embodiments, it is possible to provide more than two connections 41, 42 with corresponding hoses 43, 44 and to sub-divide the spraying head chamber so that each hose supplies fluid only to selected nozzle openings 40. Also, some of the nozzle openings may be connected to a vacuum device by outlet hoses to suck off treatment fluid. Also, an outlet may be provided in lower housing part 34, similarly to outlet 11 in the other illustrated embodiments.

As shown in FIG. 7, wafer 18 is held on carrier chuck 45 by fastening clamps 46. The carrier chuck is carried by cover 47 which hermetically cloves inlet opening 48 in the housing of the treatment chamber. This embodiment has the advantage that the substrate carrier holding substrate 18 may be inserted in the chamber and may be removed therefrom without opening the entire chamber. Furthermore, several carrier with their substrates may be prepared and the treatment of successive substrates may thus be accelerated by simply replacing the carriers one after the other. Using fastening clamps for holding the wafers on the carrier chucks enables the treated wafers to be rapidly exchanged for wafers to be treated.

What is claimed is:

1. An apparatus for the chemical treatment of disc-shaped semiconductor substrates, comprising
   (a) a fluid-tight treatment chamber,
   (b) a carrier for holding at least one disc-shaped substrate in the treatment chamber,
   (c) an elongated spraying head having a plurality of nozzles for applying a fluid to at least one surface of the substrate, the spraying head
      (1) being adjustably mounted in the treatment chamber and
      (2) having a length corresponding at least to the diameter of the disc-shaped substrate, (d) fluid inlet conduit means having portions leading from outside the treatment chamber into the treatment chamber and to the nozzles,
  (1) the fluid inlet conduit means portions in the treatment chamber being adjustable with the spraying head,
(e) adjustment drive means for displacing the spraying head transversely relative to the substrate over the surface thereof whereby the nozzles sweep over the surface in substantially parallel tracks,
(f) at least one outlet connected to a suction device for removing the applied fluid from the treatment chamber, and
(g) fluid flow shut-off members in the fluid inlet conduit means outside the treatment chamber for selectively opening and closing fluid flow to at least some of the nozzles and to connect the nozzles to different inlet conduits.

2. The apparatus of claim 1, further comprising fluid flow shut-off members in the fluid inlet conduit means outside the treatment chamber for selectively opening and closing fluid flow to at least some of the nozzles and to connect the nozzles to different inlet conduits.

3. The apparatus of claim 1, wherein spraying heads having different types of nozzles are exchangeably mounted in the treatment chamber, together with different inlet conduit means for different fluids.

4. The apparatus of claim 1, wherein the adjustment drive means comprise cylinder-piston units operable by a pressure medium supplied thereto from outside the treatment chamber for reciprocably displacing the spraying head.

5. The apparatus of claim 1, wherein the fluid inlet conduit means portions in the treatment chamber comprise different inlet conduits.

6. The apparatus of claim 1, comprising a guide rod carrying the spraying head, the elongated spraying head extending transversely to the guide rod, the guide rod being movable in its longitudinal direction and the portion of the guide rod outside the treatment chamber being connected to the adjustment drive means.

7. The apparatus of claim 1, wherein the treatment chamber has a window through which the treatment in the treatment chamber may be observed.

8. The apparatus of claim 1, wherein the treatment chamber comprises measuring instrumentation for measuring the progress of the treatment.

9. The apparatus of claim 1, further comprising temperature regulating means outside the treatment chamber for heating or cooling the treatment chamber.

10. The apparatus of claim 1, further comprising additional inlet means for filling the treatment chamber with a fluid treatment medium.

11. An apparatus for the chemical treatment of disc-shaped semiconductor substrates, comprising
  (a) a fluid-tight treatment chamber,
  (b) a carrier for holding at least one disc-shaped substrate in the treatment chamber,
  (c) an elongated spraying head having a plurality of nozzles for applying a fluid to at least one surface of the substrate, the spraying head
    (1) being adjustably mounted in the treatment chamber and
    (2) having a length corresponding at least to the diameter of the substrate,
  (d) fluid inlet conduit means having portions leading from outside the treatment chamber into the treatment chamber and to the nozzles,
    (1) the fluid inlet conduit means portions in the treatment chamber being adjustable with the spraying head,
  (e) adjustment drive means for displacing the spraying head transversely relative to the substrate over the surface thereof whereby the nozzles sweep over the surface in substantially parallel tracks,
  (f) at least one outlet connected to a suction device for removing the applied fluid from the treatment chamber, and
  (g) a hollow guide rod forming a portion of the fluid inlet conduit means and carrying the spraying head, the elongated spraying head extending transversely to the guide rod, the guide rod being movable in its longitudinal direction and the portion of the guide rod outside the treatment chamber being connected to the adjustment drive means.

12. The apparatus of claim 11, wherein the hollow guide rod passes out of the treatment chamber through a sluice chamber flushed with an inert medium.

13. An apparatus for the chemical treatment of disc-shaped semiconductor substrates, comprising
  (a) a fluid-tight treatment chamber,
  (b) a carrier for holding at least one disc-shaped substrate in the treatment chamber,
  (c) an elongated spraying head having a plurality of nozzles for applying a fluid to at least one surface of the substrate, the spraying head
    (1) being adjustably mounted in the treatment chamber and
    (2) having a length corresponding at least to the diameter of the substrate,
    (3) the carrier being arranged to hold the substrate with the surface to which the fluid is applied facing downwardly towards the spraying head while an opposite surface of the substrate is covered,
  (d) blocking grooves flushed with an inert medium and extending along the edges of the substrate whereby penetration of the applied fluid to the opposite surface is prevented,
  (e) fluid inlet conduit means having portions leading from outside the treatment chamber into the treatment chamber and to the nozzles,
    (1) the fluid inlet conduit means portions in the treatment chamber being adjustable with the spraying head,
  (f) adjustment drive means for displacing the spraying head transversely relative to the substrate over the surface thereof whereby the nozzles sweep over the surface in substantially parallel tracks, and
  (g) at least one outlet connected to a suction device for removing the applied fluid from the treatment chamber.

14. An apparatus for the chemical treatment of disc-shaped semiconductor substrates, comprising
  (a) a fluid-tight treatment chamber,
  (b) a carrier for holding at least one disc-shaped substrate in the treatment chamber,
  (c) an elongated spraying head having a plurality of nozzles for applying a fluid to at least one surface of the substrate, the spraying head
    (1) being adjustably mounted in the treatment chamber and (2) having a length corresponding at least to the diameter of the disc-shaped substrate, (d) fluid inlet conduit means having portions leading from outside the treatment chamber into the treatment chamber and to the nozzles,
  (1) the fluid inlet conduit means portions in the treatment chamber being adjustable with the spraying head,
  (2) the treatment chamber being defined by a lower housing part holding the spraying head and the fluid inlet conduit means, (e) a cover fluid-tightly closing the lower housing part,
  (1) the carrier being mounted on the cover, (f) adjustment drive means for displacing the spraying head transversely relative to the substrate over the surface thereof whereby the nozzles sweep over the surface in substantially parallel tracks, and (g) at least one outlet connected to a suction device for removing the applied fluid from the treatment chamber.

15. An apparatus for the chemical treatment of disc-shaped semiconductor substrates, comprising
  (a) a fluid-tight treatment chamber,
  (b) a carrier for holding at least one disc-shaped substrate in the treatment chamber,
    (1) the carrier being arranged to hold the edge of the substrate while leaving both surfaces of the substrate unobstructed,
  (c) a respective elongated spraying head adjustably mounted in the treatment chamber and having a plurality of nozzles for applying a fluid to each surface of the substrate, the spraying heads having a length corresponding at least to the diameter of the substrate,
  (d) fluid inlet conduit means having portions leading from outside the treatment chamber into the treatment chamber and to the nozzles,
    (1) the fluid inlet conduit means portions in the treatment chamber being adjustable with the spraying head,
  (e) adjustment drive means for displacing the spraying head transversely relative to the substrate over the surface thereof whereby the nozzles sweep over the surface in substantially parallel tracks, and
  (f) at least one outlet connected to a suction device for removing the applied fluid from the treatment chamber.

* * * * *